United States Patent [19]
DeVries

[11] 4,065,789
[45] Dec. 27, 1977

[54] SURFACE WAVE DEVICE FOR USE IN A GHOST CANCELLATION SYSTEM

[75] Inventor: Adrian J. DeVries, Elmhurst, Ill.

[73] Assignee: Zenith Radio Corporation, Glenview, Ill.

[21] Appl. No.: 757,118

[22] Filed: Jan. 5, 1977

[51] Int. Cl.$^2$ .................. H04N 5/21; H03H 7/30; H01V 7/00
[52] U.S. Cl. .................................. 358/167; 358/905; 333/30 R; 333/72; 310/313; 310/366; 325/474
[58] Field of Search ............... 310/9.8; 333/30 R, 72; 358/167, 905; 325/473–476; 328/165

[56] References Cited
U.S. PATENT DOCUMENTS

| | | | |
|---|---|---|---|
| 3,956,585 | 5/1976 | Butler et al. | 358/905 X |
| 3,988,703 | 10/1976 | DeVries | 333/30 R X |
| 4,013,834 | 3/1977 | Kino et al. | 333/30 R X |

Primary Examiner—Robert L. Griffin
Assistant Examiner—Aristotelis M. Psitos
Attorney, Agent, or Firm—Jack Kail

[57] ABSTRACT

A ghost cancellation system includes a surface-wave device operable for developing a replica of the ghost component of a video signal, which replica is combined with the video signal to eliminate or cancel the ghost component. The surface-wave device comprises an input transducer responsive to a modulated video signal for launching uniform acoustic surface-waves along a path traversing a balanced pair of output transducers and impinging upon a reflector array. The reflector array includes means for initiating non-uniform surface-wave reflections suitable for causing the output transducers to develop an output electrical signal comprising the ghost replica.

21 Claims, 6 Drawing Figures

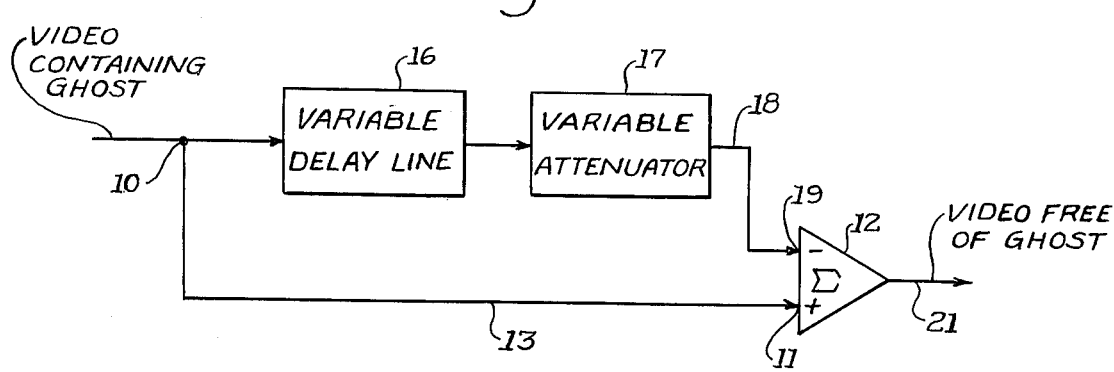
PRIOR ART  Fig. 1
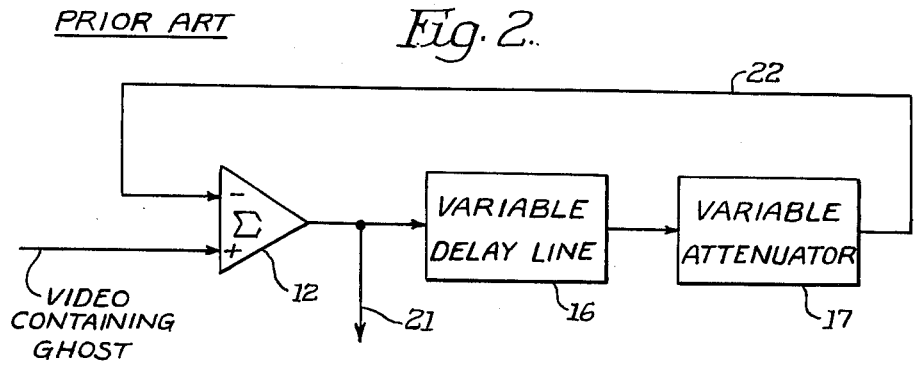
PRIOR ART  Fig. 2
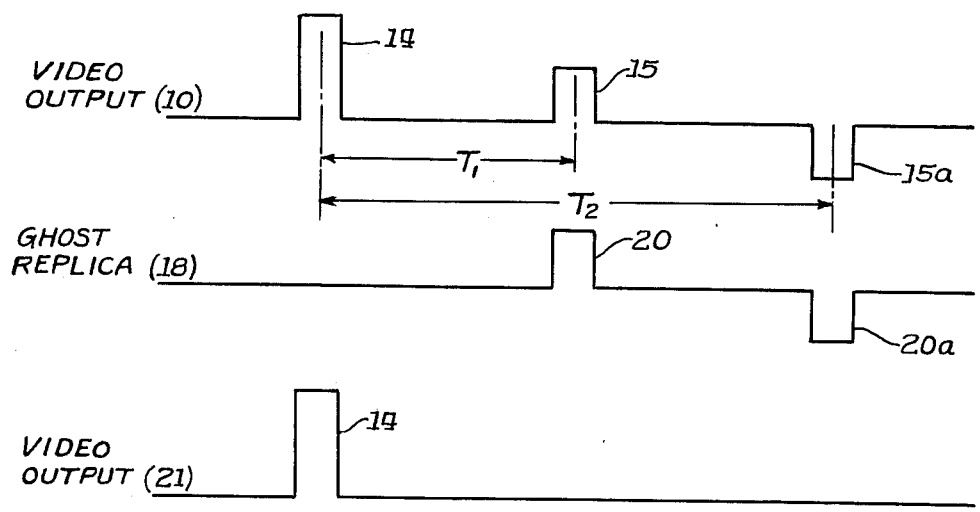
Fig. 3

SURFACE WAVE DEVICE FOR USE IN A GHOST CANCELLATION SYSTEM

BACKGROUND OF THE INVENTION

This invention relates generally to ghost cancellation systems for use with television receivers and, more particularly, to acoustic surface-wave devices suitable for use with such ghost cancellation systems.

Numerous effects are known to have an influence on the integrity of a video signal between its origin at a television transmitter and its eventual application to a television receiver picture tube for reproduction of the televised image. In particular, the presence of ghosts in a video channel is a well known phenomenon resulting from multipath transmission introduced by various forms of signal reflectors. Considering "over the air" transmissions, delayed and normally attenuated versions of the main video signal commonly arrive at the receiver from indirect transmission paths established by the presence of reflecting objects within the radiation pattern of the transmitting antenna. In cable television transmission systems, misterminations and impedance discontinuities similarly cause ghost generating reflections along portions of the signal path. In either event, the ghost is manifested in the receiver by an electrical signal having substantially the same waveform as the main signal, but generally delayed in time and normally attenuated in amplitude therefrom. Thus, the net signal arriving at the receiver consists of the sum of the desired or main signal transmitted over a direct path and a reflected signal or ghost that is normally attenuated and delayed with respect to the main signal.

Furthermore, depending on the differential delay between the direct and indirect paths, the ghost will exhibit either a positive or negative polarity with respect to the main signal. Such results because the polarity of the ghost signal alternates between positive and negative directions as the relative propagation path length difference of the main and ghosts signals change by one-half carrier wavelength. Therefore, the ghost signal can represent either a "negative" or a "positive" ghost depending on the phase relationship of the direct and indirect RF carriers.

Conventionally, ghost cancellation devices employ the technique of delay and attenuation in a feedback or feedforward path to eliminate the effect of ghosts caused by multipath transmissions. Essentially, a ghost of the correct magnitude, polarity and differential delay is synthesized from the received signal so that when the "synthetic" ghost is combined with the received signal the synthetic ghost cancels the real ghost and yields a ghost-free picture.

In early devices, adjustable lengths of cable were connected for developing the "synthetic" ghost by appropriately delaying the received signal along a branched path. The delayed signal, after being attenuated and recombined with the received signal, was therefore effective for cancelling the later arriving ghost. Employing generally similar principles, more recently proposed ghost cancellation systems commonly utilize charge transfer devices such as bucket-brigade devices to effectuate the required delay in the received signal. Exemplary of such systems is the ghost cancellation system disclosed in U.S. Pat. No. 3,935,536 issued Jan. 27, 1976 to Kimura et al which discloses the use of a bucket-brigade device connected to a summing network in feedforward relationship. On the other hand, U.S. Pat. No. 3,956,585 issued May 11, 1976 to Butler et al discloses a ghost cancellor wherein a charge transfer device is connected to a summing network in feedback relationship.

It is also known to synthesize delayed replicas of the received video signal by means of surface-wave devices. Typically, surface-wave devices used for this purpose comprise an acoustic surface-wave propagating medium having an input transducer coupled thereto for launching surface-waves in response to modulated video signals. An array of output transducers is deposited on the medium and includes means for deriving outputs by selectively tapping one or more of the transducers. Therefore, to derive an output signal having a relatively long delay a remote transducer is tapped whereas a short delay is achieved by tapping a transducer positioned in relatively close proximity to the input transducer. Devices of the latter type tend to become rather cumbersome since their overall length must be sufficient to accommodate the range of delay values expected to be encountered in a real application. Moreover, conventional surface-wave devices used in ghost cancellation systems generally provide no facility for adjusting the amplitude of the synthesized ghost nor for producing synthesized ghosts having both negative and positive polarities relative to the main signal.

It is therefore an object of the present invention to devise a new and improved surface-wave device suitable for use in a television ghost cancellation system.

It is a further object of the present invention to provide a surface-wave device suitable for use with a television ghost cancellation system which does not require the substantial use of external circuits or devices for additionally modifying a synthesized or replica ghost signal.

SUMMARY OF THE INVENTION

A surface-wave device constructed in accordance with the present invention is useful for selectively developing output signals of opposite polarity and comprising delayed and attenuated replicas of an applied input signal. In a preferred embodiment, the surface-wave device is connected for receiving a modulated video signal developed in the television receiver and for synthesizing therefrom a replica of the ghost component of the video signal. The synthesized ghost replica is characterized by an amplitude, polarity and differential delay such that when summed with the video signal a substantially ghost-free signal results.

In particular, the surface-wave device comprises an acoustic surface-wave propagating medium having an input surface-wave transducer coupled thereto for launching a uniform acoustic surface-wave along a path in the medium in response to an input signal. A balanced output transducer, spaced from the input transducer, is coupled to the medium and configured for developing an electrical output signal only in response to non-uniform energization thereof. A reflection means, coupled to the medium and spaced from the input and output transducers, is operable for initiating non-uniform surface wave reflections in response to the uniform wave launched by the input transducer. Means are provided for adjusting the reflection means such that the non-uniform surface-wave reflection induces the output transducer to develop an electrical output signal comprising the desired replica signal.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawing, in the several figures of which like reference in numerals identify like elements, and in which:

FIG. 1 is a block diagram illustrating the relationship between the essential components of a conventional feedfoward ghost cancellation system;

FIG. 2 is a similar block diagram illustrating the relationship between the essential components of a conventional feedback ghost cancellation system;

FIG. 3 is a graphical representation of the waveforms present at various points in the diagrams of FIGS. 1 and 2;

DESCRIPTION OF THE PREFERRED EMBODIMENT

Figure 4:
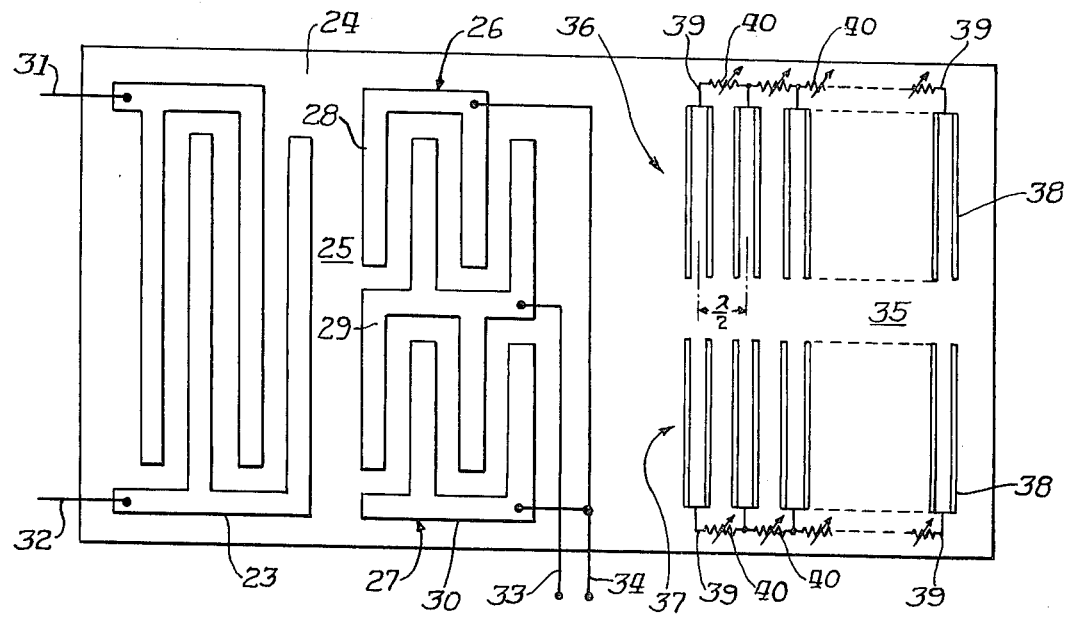
FIG. 4 is a partly schematic view of an acoustoelectric surface-wave device constructed in accordance with the present invention and adapted for use in, for example, the schemes of FIGS. 1 and 2.

With reference to the previous discussion herein, conventional ghost cancellation systems most commonly used in television receivers are generally constructed in accordance with the feedforward and feedback implementations shown in FIGS. 1 and 2. In the feedforward system shown in FIG. 1, the incoming video signal, including its associated ghost component, is supplied from a node 10 to one input 11 of a summing amplifier 12 along a direct line 13. With reference to FIG. 3, it will be recognized that the incoming video signal consists of a main or desired component 14 and a reduced amplitude ghost component 15 delayed in time with respect to main component 14. Depending on the differential path length of the main signal transmission path and the ghost transmission path, the ghost may be characterized by a positive polarity as indicated by signal 15 or a negative polarity as indicated by 15a. Typically, the delay between the main component 14 and the ghost component 15 or 15a of the video signal will be in the neighborhood of 0.1 to 10 microseconds.

The incoming video signal developed at node 10 is also applied to a variable delay line 16 which is operable for introducing into main signal component 14 a delay equivalent to the delay T1 characterizing ghost 15 or T2 characterizing ghost 15a. The delayed version of main signal component 14 is then supplied to a variable attenuator 17 which reduces the amplitude of the delayed signal to a level corresponding to the amplitude of ghost 15. The output 18 of variable attenuator 17 accordingly comprises a replica 20 or 20a of ghost 15 or 15a occurring in time coincidence therewith. The ghost replica is then applied to a second input of summing amplifier 12 where it is subtracted from the incoming video signal developed at node 10 to cancel ghost 15 or 15a resulting in a ghost free video signal at an output 21 of the summing amplifier. Although not specifically shown, it will be appreciated that polarity control means are typically included in the delay path to invert ghost replica 20 for producing negative ghost replica 20a in situations where a negative ghost is encountered.

The feedback ghost cancellation system illustrated in FIG. 2 is essentially similar in operation to the feedforward system discussed above. In this case, however, the incoming video signal is taken from the output of summing amplifier 12 and applied through a feedback path 22 including variable delay line 16 and variable attenuator 17 to the negative input of amplifier 12. The ghost replica synthesized in feedback path 22 is effective for cancelling the ghost component of the incoming video signal in a manner similar to that described above. That is, the ghost replica, occurring in time coincidence with the video signal ghost component, is subtracted from the incoming video signal to produce an output video signal free of ghosts.

The acoustic surface-wave device of the present invention, which is illustrated in detail in FIG. 4, is suitable for performing the functions of variable delay line 16 and variable attenuator 17 in either the feedforward or the feedback ghost cancellation arrangement discussed above. Furthermore, the illustrated surface-wave device includes the capability of selectively generating positive and negative ghost replicas as desired.

Figure 5:
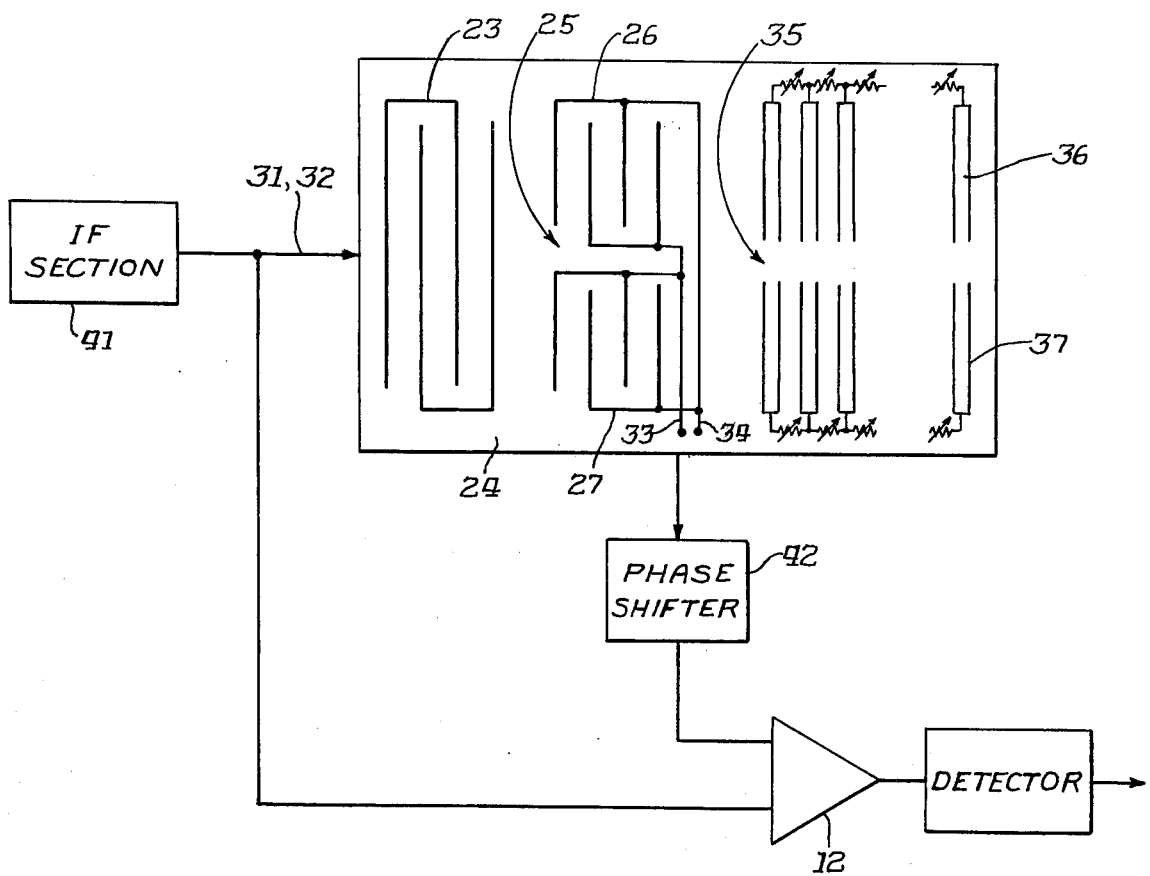
FIG. 5 illustrates, partly in block diagram form, a method of incorporating the device shown in FIG. 4 in a feedforward ghost cancellation system.

Referring now in detail to FIG. 4, the surface-wave device of the present invention comprises an input electrode array 23 which is mechanically coupled to a piezo-electric acoustic-wave propagating medium 24 such as $LiNbO_3$. Preferably, input electrode array 23 comprises an interdigital transducer constructed of two interleaved comb-type electrodes of a conductive material such as aluminum. Another electrode array 25 is also mechanically coupled to acoustic-wave propagating medium 24 to constitute therewith an output transducer. For reasons which will become apparent output transducer 25 is centrally split effectively forming a pair of constituent transducers 26 and 27. Transducer 26 comprises a comb-type electrode 28 interdigitated with a portion of a common central electrode structure 29 and, similarly, transducer 27 comprises a generally comb-type electrode 30 interdigitated with another portion of common electrode structure 29. Alternately, as depicted in FIG. 5, output transducer 25 may comprise a pair of independent transducers 26 and 27 each consisting of a pair of interleaved comb-type electrodes. Furthermore, although transducers 23 and 25 have been shown with solid fingers, similarly configured transducers having split-connected fingers may also be employed.

External electrical connections to the surface-wave device are made by a pair of input lines 31 and 32 connected to the distal ends of input transducer 23 and by a pair of output lines 33 and 34 connected to output transducer 25. Output lines 33 and 34 connect to transducer 25 such that its constituent transducers 26 and 27 are connected in parallel but in opposite phase. Thusly configured, ouput transducer 25 along with associated output lines 33 and 34 comprise a balanced transducer. It will be understood that input lines 31 and 32 correspond to the input to variable delay line 16 and, therefore, in use are connected for receiving an incoming modulated video signal. Similarly, output lines 33 and 34 correspond to the output of variable attenuator 17 and therefore are effective for developing the synthesized ghost replica signal.

In accordance with principles well known in the art, input transducer 23 will launch or propagate a uniform surface-wave along medium 24 in the direction of output transducer 25 in response to the application of an incoming modulated video signal to input lines 31 and 32. As used hereinafter and in the appended claims, the term "uniform" as applied to a surface-wave is intended to imply that the surface-wave is characterized by a wave front having a width substantially corresponding to the length of the interdigitated electrodes of input transducers 23 and having a constant amplitude and phase therealong. On the other hand, a surface-wave having a wave front of lesser effective width but of constant amplitude and phase will be referred to as a "non-uniform" surface-wave. More specifically, as used herein the term "non-uniform" refers to a wave front having a width of about one-half the width of transducer 23. The uniform surface-wave propagated by input transducer 23 will impinge upon output transducer 24 and cause constituent transducers 26 and 27 to exhibit corresponding potentials. However, due to the fact that the constituent transducers are connected in balanced relationship, i.e. connected in parallel and opposite phase, an output potential will not be developed on output lines 33 and 34. Stated otherwise, the potential developed by constituent transducer 26 will cancel the potential developed by constituent transducer 27 as viewed from output lines 33 and 34. It will thus be apparent that output transducer 25 will be responsive for developing a potential on output lines 33 and 34 only in response to non-uniform activation by a non-uniform surface-wave. Moreover, as long as the number of electrode fingers comprising output transducer 25 are maintained relatively low, the degree of coupling between the output transducer and surface-waves propagated along medium 24 will be relatively insignificant. Therefore, the uniform surface-wave launched by input transducer 23 in response to an incoming video signal will be substantially unaffected by output transducer 25 and will continue to propagate substantially unmodified toward a reflector array 35.

Reflector array 35 comprises two rows 36 and 37 of spaced conductive fingers 38 coupled to medium 24. The conductive fingers comprising row 36 are disposed for receiving the uniform surface-wave from input transducer 23 and extend laterally such that their distal ends are in substantial alignment with the distal ends of the interdigitated electrodes of constituent transducer 26. In a similar fashion, the conductive fingers of row 37 are also disposed for receiving the uniform surface-wave and extend laterally with their distal ends in substantial alignment with the distal ends of the interdigitated electrodes of constituent transducer 27. In this regard, it is convenient to visualize the path traversed by the uniform surface-wave launched by input transducer 23 as occupying two individual tracks, one track comprising the upper portion of medium 24 including the upper half of input transducer 23, constituent transducer 26 and row 36 of conductive fingers 38. The lower track would then comprise the lower half of input transducer 23, constituent transducer 27 and row 37 of conductive fingers 38. It will be appreciated that the notational reference to an upper and a lower track has been introduced for purposes of explanation only and that in terms of physical reality no such tracks actually exist in medium 24.

Each successive pair of conductive fingers 38 in rows 36 and 37 are interconnected by a shorting bar 39, adjacent shorting bars 39 in each of the rows being in turn interconnected by a plurality of adjustable resistance elements 40. Conductive fingers 38 therefore effectively comprise a series of split-connected fingers, (see, for example, U.S. Pat. No. 3,727,155) each adjacent set of which is interconnected by one of the adjustable resistance elements. Alternately, the split-connected fingers may comprise solid fingers, adjacent ones of which are interconnected by resistance elements 40. The foregoing structure is characterized in that when the value of a resistance element between a particular pair of split-connected fingers is zero, no reflection from these fingers will ensue. However, if the resistance value is set at a finite level a reflection will be caused by the set of finger pairs and will be proportional to the level of the resistance. For proper operation the spacing between adjacent split-connected sets is made to equal one-half wave length at the carrier frequency. A reflection of the uniform surface-wave initiated by reflector row 36 will propagate back toward output transducer 25 along the upper track of medium 24. Since this reflection comprises a non-uniform surface-wave, a potential will be induced in constituent transducer 26 which is effective for developing a signal having a given phase on output lines 33 and 34. Among other factors, the phase of this output signal will, or course, depend upon the path lengths traversed by the surface waves along medium 24. Analogously, a reflection initiated by reflector row 37 will propagate back toward output transducer 25 along the lower track of medium 24. This reflection will comprise a non-uniform surface-wave which will result in the development of an output signal on lines 33 and 34 180° out of phase with respect to the output signal resulting from a reflection initiated by reflector row 36. In either case, the output signals developed on lines 33 and 34 will comprise reduced amplitude and delayed versions of the originally propagated modulated video signal and will be characterized by a 180° phase difference.

Adjustable resistance elements 40 may be operated either manually or under the control of a suitable automatic system. It will be appreciated that when a ghost replica signal having a short delay is desired one of the resistance elements toward left of reflector array 35 will be appropriately increased. As a result, the reflected non-uniform surface-wave with traverse a relatively short distance before being converted into an electrical signal by output transducer 25. On the other hand, when a large delay is required, one of the resistance elements more remote from the output transducer is increased in value. The reflected surface-wave will then traverse a proportionately larger distance before being finally operated upon by output transducer 25. In addition, a plurality of ghost replicas may be developed to cancel the effect of multiple ghosts in the video signal by appropriately setting a corresponding number of the resistance elements.

As previously mentioned, the amplitude of the nonuniform surface-wave reflection, and therefore the amplitude of the synthesized ghost replica signal developed at output lines 33 and 34, is controlled by adjusting the value of the resistance element initiating the reflection. Increasing the resistance level proportionately increases the amplitude of the reflection and vice versa. Also, by appropriately selecting the resistance value from either reflector row 36 or 37 a facility for selectively synthesizing oppositely phased ghost replica signals is provided.

In many instances it may prove difficult to obtain adjustable resistance elements 40 which are capable of substantially exhibiting a zero value. Such can be easily compensated for, however, by setting the corresponding resistance elements in rows 36 and 37 to equal finite values. When this is done, equally delayed and amplitude reduced non-uniform surface-waves are propagated along the upper and lower tracks of medium 24 which induce potentials in output transducer 25 that are effectively cancelled by the balanced connection of constituent transducers 26 and 27. Thus, no output signal is developed at output lines 33 and 34.

Since surface-wave devices cannot operate at video frequencies, it is necessary to modulate the incoming video signal applied to lines 31 and 32 on a carrier signal. The use of a separate modulating device for this purpose may be avoided by locating the ghost cancellation system in the IF signal path of the television receiver as shown in FIG. 5. Accordingly, in FIG. 5 the video signal modulated by the IF carrier is applied from the IF section 41 of a television receiver to input lines 31, 32 and also to one input of summing amplifier 12. The ghost replica signal developed on output lines 33, 34 is then coupled via a variable phase shifter 42 to the other input of summing amplifier 12 where it is effective for cancelling the effect of ghosts from the received signal. In this regard, it will be recalled that although two oppositely phased signals are available at output lines 33, 34, depending on the modulating frequency and the path lengths traversed by propagating surface-waves along medium 24, neither output signal is necessarily in phase with the input IF signal. Phase shifter 42 is therefore included in the output circuit and is operable for adjusting the phase of the output signals initiated by reflector rows 36 and 37 and appearing at output lines 33, 34 such that one of the signals is in phase with the input IF signal whereby the other signal is 180° out of phase therewith. It will be understood that the output signal in phase with the IF carrier corresponds to positive ghost replicas and that the output signal 180° out of phase with the IF carrier corresponds to negative ghost replicas. Also, in order to avoid the introduction of phase discrepancies, it is necessary to maintain the IF carrier frequency at a relatively constant value. Such may be accomplished, for example, through the use of a highly stable automatic frequency control system.

Figure 6:
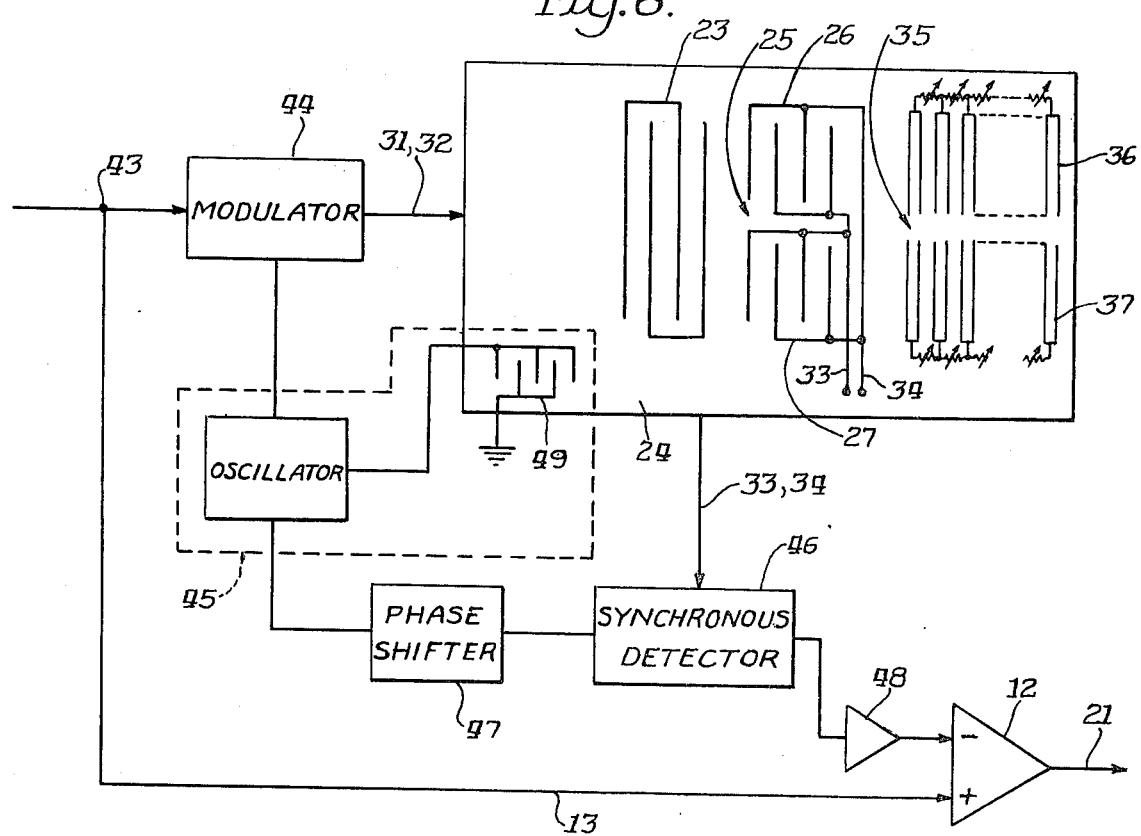
FIG. 6 illustrates, partly in block diagram form, another method of incorporating the device shown in FIG. 4 in a ghost cancellation system.

An alternative embodiment using independent modulation techniques is shown in FIG. 6. In this case, the video signal developed in the television receiver is coupled from a node 43 to a modulator 44 and to the positive input of summing amplifier 12. Modulator 44 is supplied from an oscillator 45 which also supplies a synchronous detector 46 through an adjustable phase shifter 47. Synchronous detector 46 is connected for coupling the output signal developed on lines 33, 34 to the negative input of summing amplifier 12 through a system adjusting variable gain amplifier 48 to achieve ghost cancellation.

In operation, the video signal developed at node 43 is modulated by modulator 44 on a carrier signal having a frequency determined by oscillator 45. As previously explained, this results in the production of oppositely phased ghost replica signals on lines 33, 34 which are detected by synchronous detector 46 and applied therefrom to summing amplifier 12. In order to insure that both positive and negative polarity ghost replica signals are produced, phase shifter 47 is adjusted such that the phase of the oscillator signal applied to the synchronous detector is effectively the same as that of one of the signals applied over lines 33, 34 and thereby 180° out of phase with the other one. The detected outputs from the synchronous detector then correspond to positive and negative ghosts.

While oscillator 45 may assume a number of conventional configurations, it is preferable to use a temperature compensated device such as shown in FIG. 6. Oscillators of this type are more fully discussed in U.S. Pat. No. 3,787,612 assigned to the assignee of the present invention. It will be recognized that temperature variations affect the velocity of surface-waves propagated along medium 24 which, in turn, may result in phase variations of the signals developed on output lines 33, 34 relative to the carrier signal developed by oscillator 45. Consequently, the signals applied to synchronous detector 46 from phase shifter 47 and lines 33, 34 will not be in the proper phase relationship thereby degrading operation of the system. Such may be conveniently compensated for by providing an oscillator of the type shown including a transducer 49 coupled to medium 24. Any temperature change causing a change in surface-wave propagation velocity will induce a similar change in the operating frequency of oscillator 45 thereby forcing the existence of proper phase relationship between the signals applied to detector 46. Temperature stabilization of the system is thus conveniently achieved. While an oscillator having a one port surface-wave device for controlling the oscillator frequency is shown in FIG. 6, it will be appreciated that oscillators using other surface-wave device configurations (such as two-port surface-wave devices) can also be used.

Thus the invention provides a new and improved surface-wave device suitable for use in a television receiver ghost cancellation system and which has substantial advantages over predecessor devices. It provides a facility for developing a ghost replica signal characterized by the requisite delay, amplitude and polarity in a single relatively uncomplicated surface-wave device. Furthermore, the overall length of the device is about one half the length of other surface-wave devices used in ghost cancellation applications since the processed signal is propagated over a folded path.

While particular embodiments of the invention has been shown and described, it will be obvious to those skilled in the art, that changes and modifications may be made without departing from the invention in its broader aspects, and therefore, the aim in the appended claims is to cover all such changes and modifications as fall within the true spirit and scope of the invention.

What is claimed is:

1. An acousto-electric surface-wave signal translating device comprising:
   an acoustic surface-wave propagating medium;
   an input surface-wave transducer coupled to said medium and responsive to an input signal for propagating a uniform acoustic surface-wave along a predetermined path in said medium;
   an output surface-wave transducer coupled to said medium along said path and spaced from said input transducer for developing an output electrical signal only in response to non-uniform exposure to surface-waves; and
   reflection means coupled to said medium along said path and spaced from said input and output transducers, said reflection means being responsive to said uniform surface-wave for initiating reflections along said path comprising non-uniform surface-waves for causing said output transducer to develop an electrical output signal comprising delayed replica of said input signal.

2. The acousto-electric surface-wave device according to claim 1 wherein said output transducer is configured for having a relatively insignificant effect on surface waves propagated along said medium.

3. The acousto-electric surface-wave device according to claim 2 wherein said reflection means includes means operable for varying the amplitude and delay of said replica signal.

4. The acousto-electric surface-wave device according to claim 3 wherein said reflection means further includes means cooperable with said output transducer for selectively causing said replica signal to comprise signals exhibiting opposite phase relationship.

5. The acousto-electric surface-wave device according to claim 4 wherein said reflection means is configured for selectively initiating non-uniform surface-wave reflections occupying two distinct longitudinal tracks along said path and wherein said output transducer includes circuit means cooperative therewith for developing a first output electrical signal in response to a non-uniform surface-wave reflection initiated along one of said longitudinal tracks and a second output electrical signal in response to a non-uniform surface-wave reflection initiated along the other of said longitudinal tracks, said first and second output electrical signals being 180° out of phase with each other.

6. The acousto-electric surface-wave device according to claim 5 wherein said output transducer comprises a first transducer disposed along said one of said longitudinal tracks and a second transducer disposed along said other of said longitudinal tracks, said circuit means being arranged for interconnecting said first and second transducers in balanced relationship.

7. The acousto-electric surface-wave device according to claim 6 wherein said reflection means comprises a first row of spaced and transversely extending conductive fingers disposed in said one of said longitudinal tracks and a second row of spaced and transversely extending fingers disposed in said other of said longitudinal tracks, said reflection means further including adjustable impedance elements interconnecting adjacent fingers in each of said rows, the settings of said adjustable elements determining the reflectivity characteristics of their associated fingers for establishing the amplitude and delay of said first and second output electrical signals.

8. The acousto-electric surface-wave device according to claim 7 wherein each of said fingers comprises a set of split-connected fingers.

9. An acousto-electric surface-wave device for use with a television receiver ghost cancellation system of the type including means for combining a television signal having a main component and a ghost component with a replica of said ghost component for effecting ghost cancellation, comprising:

an acoustic surface-wave propagating medium;
an input surface-wave transducer coupled to said medium and responsive to said video signal for propagating a uniform acoustic surface-wave along a predetermined path in said medium;
an output surface-wave transducer coupled to said medium along said path at a position spaced from said input transducer for developing an electrical output signal only in response to non-uniform energization thereof; and
reflection means coupled to said medium along said path and spaced from said input and output transducers, said reflection means being responsive to said uniform surface-wave for initiating reflections along said path comprising a non-uniform surface-waves for causing said output transducer to develop an electrical output signal comprising said ghost replica.

10. The acousto-electric surface-wave device according to claim 9 wherein said output transducer is configured for having a relatively insignificant effect on surface waves propagated along said medium.

11. The acousto-electric surface-wave device according to claim 10 wherein said reflection means comprises an adjustable reflector array operable for selectively varying the amplitude of said reflection and the length of the portion of said path along which said non-uniform surface-waves are propagated between said reflection means and said output transducer for establishing, respectively, the amplitude of said ghost replica and the delay between said main component and said ghost replica.

12. The acousto-electric surface-wave device according to claim 11 wherein said output transducer comprises first and second transducers disposed one above the other transversely of said path and circuit means for developing said output electrical signal, said circuit means interconnecting said first and second transducers in balanced relationship.

13. The acousto-electric surface-wave device according to claim 12 wherein said adjustable reflector array comprises first and second rows of spaced conductive fingers extending transversely of said path, said first and second rows being disposed for initiating non-uniform surface-wave reflections for energizing, respectively, said first and second transducers, said circuit means being responsive to reflections from said first row for developing an output signal having a first polarity and to reflections from said second row for developing an output signal having a polarity 180° out of phase with respect to said first polarity.

14. The acousto-electric surface-wave device according to claim 13 including adjustable impedance means interconnecting adjacent ones of said fingers in each of said rows, the settings of said adjustable impedance means determining which of said fingers are reflective and the amplitudes of the corresponding reflections.

15. The acousto-electric surface-wave device according to claim 14 wherein said input transducer, said output transducer and said reflection means are substantially in alignment along said path and wherein the transverse dimensions of said input and output transducers are substantially equal to twice the transverse dimensions of said conductive fingers.

16. The acousto-electric surface-wave device according to claim 15 wherein said input transducer is connected for receiving the IF signal developed in said television receiver and including adjustable phase shifting means connected to said output transducer operable for selectively varying the phase of said electrical output signal relative to said IF signal.

17. The acousto-electric surface-wave device according to claim 16 wherein said television signal comprises the video signal developed in said television receiver and including:

an oscillator for developing a carrier signal;
means for modulating said video signal on said carrier;

means applying said modulated video signal to said input transducer;

synchronous detection means connected for detecting said output electrical signal; and adjustable phase shifting means coupling said carrier signal for gating said synchronous detection means for developing a detected output signal comprising said ghost replica signal, said ghost replica signal being characterizable by positive polarity and negative polarity video signals.

18. The acousto-electric surface-wave device according to claim 17 wherein said oscillator includes a frequency determining transducer coupled to said medium for varying the frequency of said carrier signal in accordance with the temperature of said medium.

19. The acousto-electric surface-wave device according to claim 7 wherein the axis of said fingers are spaced by an odd numger of half wave lengths at the frequency of said input signal.

20. The acousto-electric surface-wave device according to claim 16 wherein the axis of said fingers are spaced by an odd number of half wavelengths at the frequency of said IF signal.

21. The acousto-electric surface-wave device according to claim 17 wherein the axis of said fingers are spaced by an odd number of half wavelengths at the frequency of said carrier signal.

* * * * *